United States Patent
Iwata et al.

(10) Patent No.: US 10,149,420 B2
(45) Date of Patent: Dec. 4, 2018

(54) COMPONENT MOUNTING METHOD AND COMPONENT MOUNTING SYSTEM

(71) Applicant: Panasonic Intellectual Property Management Co., Ltd., Osaka (JP)

(72) Inventors: Isato Iwata, Aichi (JP); Hirokazu Takehara, Yamanashi (JP); Takuya Yamazaki, Yamanashi (JP); Hiroki Sagara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 523 days.

(21) Appl. No.: 14/794,368

(22) Filed: Jul. 8, 2015

(65) Prior Publication Data
US 2016/0021761 A1    Jan. 21, 2016

(30) Foreign Application Priority Data
Jul. 17, 2014    (JP) .................................. 2014-146439

(51) Int. Cl.
    *H05K 13/08*    (2006.01)
(52) U.S. Cl.
    CPC ............................. *H05K 13/085* (2018.08)

(58) Field of Classification Search
    CPC ........... H05K 13/08; H05K 13/0404–13/0413; H05K 13/085
    See application file for complete search history.

(56) References Cited

U.S. PATENT DOCUMENTS

| | | | |
|---|---|---|---|
| 2008/0262642 A1 | 10/2008 | Maenishi et al. | |
| 2009/0099678 A1* | 4/2009 | Kurata | G05B 19/41865 700/106 |

FOREIGN PATENT DOCUMENTS

| | | | |
|---|---|---|---|
| JP | 2006-005332 A | | 1/2006 |
| JP | 2007-059563 A | | 3/2007 |
| JP | 2013-125939 A | | 6/2013 |
| JP | 2013125939 A | * | 6/2013 |
| JP | 2014-027227 A | | 2/2014 |
| JP | 2014027227 A | * | 2/2014 |

* cited by examiner

*Primary Examiner* — Livius Radu Cazan
(74) *Attorney, Agent, or Firm* — Pearne & Gordon LLP

(57) ABSTRACT

A component mounting method is provided in a component mounting apparatus that mounts a component onto a board using a plurality of pieces of production data linked to component data. The method includes executing, when the component data is changed, a simulation of a production cycle time based on the production data, and comparing a simulation result of the production cycle time after change of the component data with a production cycle time or a simulation result of the production cycle time before change of the component data, and outputting a comparison result.

7 Claims, 13 Drawing Sheets

FIG. 9A

<CYCLE TIME IMPROVEMENT EXAMPLE DUE TO CHANGE IN OPERATION SEQUENCE>
[P]: COMPONENT TYPE
[V]: SPEED (RATIO WITH RESPECT TO MAXIMUM SPEED: %)

BEFORE CHANGE OF COMPONENT DATA

| TURN NUMBER | | | (1) | (2) | (3) |
|---|---|---|---|---|---|
| UNIT HEAD | (1) | [P] | Pa | Pa | Pa |
| | | [V] | 100 | 100 | 100 |
| | (2) | [P] | Pc | Pc | Pc |
| | | [V] | 100 | 100 | 100 |
| | (3) | [P] | Pb | Pb | Pb |
| | | [V] | 100 | 100 | 100 |

FIG. 9B

COMPONENT DATA CHANGE

SPEED CHANGE: CHANGE SPEED OF COMPONENT TYPE Pb TO 80%

| TURN NUMBER | | | (1) | (2) | (3) |
|---|---|---|---|---|---|
| UNIT HEAD | (1) | [P] | Pa | Pa | Pa |
| | | [V] | 100 | 100 | 100 |
| | (2) | [P] | Pc | Pc | Pc |
| | | [V] | 100 | 100 | 100 |
| | (3) | [P] | Pb | Pb | Pb |
| | | [V] | *80 | *80 | *80 |

FIG. 9C

CYCLE TIME IMPROVEMENT PLAN EXECUTION

SEQUENCE REGENERATION

| TURN NUMBER | | | (1) | (2) | (3) |
|---|---|---|---|---|---|
| UNIT HEAD | (1) | [P] | Pb | Pc | Pa |
| | | [V] | 80 | 100 | 100 |
| | (2) | [P] | Pb | Pc | Pa |
| | | [V] | 80 | 100 | 100 |
| | (3) | [P] | Pb | Pc | Pa |
| | | [V] | 80 | 100 | 100 |

<CYCLE TIME IMPROVEMENT EXAMPLE DUE TO CHANGE OF COMPONENT ARRANGEMENT IN COMPONENT SUPPLY SECTION>

FIG. 10A
BEFORE CHANGE OF COMPONENT DATA

| TURN NUMBER | | | (1) | (2) | (3) |
|---|---|---|---|---|---|
| UNIT HEAD | (1) | [P] | Pa | Pa | Pa |
| | | [V] | 100 | 100 | 100 |
| | (2) | [P] | Pc | Pc | Pc |
| | | [V] | 100 | 100 | 100 |
| | (3) | [P] | Pd | Pb | Pb |
| | | [V] | 80 | 100 | 100 |

FIG. 10B
COMPONENT DATA CHANGE

SPEED CHANGE: CHANGE SPEED OF COMPONENT TYPE Pb TO 80%

| TURN NUMBER | | | (1) | (2) | (3) |
|---|---|---|---|---|---|
| UNIT HEAD | (1) | [P] | Pa | Pa | Pa |
| | | [V] | 100 | 100 | 100 |
| | (2) | [P] | Pc | Pc | Pc |
| | | [V] | 100 | 100 | 100 |
| | (3) | [P] | Pd | Pb | Pb |
| | | [V] | 80 | *80 | *80 |

FIG. 10C
CYCLE TIME IMPROVEMENT PLAN EXECUTION

COMPONENT MOVEMENT: MOVE COMPONENT TYPE Pb SO THAT COMPONENT TYPES Pb AND Pd CAN BE SUCTIONED AT THE SAME TIME, AND REGENERATE SEQUENCE

| TURN NUMBER | | | (1) | (2) | (3) |
|---|---|---|---|---|---|
| UNIT HEAD | (1) | [P] | Pb | Pc | Pa |
| | | [V] | 80 | 100 | 100 |
| | (2) | [P] | Pb | Pc | Pa |
| | | [V] | 80 | 100 | 100 |
| | (3) | [P] | Pd | Pc | Pa |
| | | [V] | 80 | 100 | 100 |

FIG. 11A
(APPARATUS 1) BEFORE CHANGE OF COMPONENT DATA

<CYCLE TIME IMPROVEMENT EXAMPLE DUE TO EXCHANGE OF COMPONENT ARRANGEMENT BETWEEN PLURAL APPARATUSES>

PRODUCTION CYCLE TIME 30 SECONDS (BOTTLE NECK)

| | TURN NUMBER | | (1) | (2) | (3) |
|---|---|---|---|---|---|
| UNIT HEAD | (1) [Na] | [P] | Pa | Pa | Pa |
| | | [V] | 100 | 100 | 100 |
| | (2) [Na] | [P] | Pc | Pc | Pc |
| | | [V] | 100 | 100 | 100 |
| | (3) [Na] | [P] | Pc | Pc | Pb |
| | | [V] | 100 | 100 | 100 |

54, 55

FIG. 11B
COMPONENT DATA CHANGE

SPEED CHANGE: CHANGE SPEED OF COMPONENT TYPE Pb TO 80%
PRODUCTION CYCLE TIME IS CHANGED TO 31 SECONDS (BOTTLE NECK DETERIORATES)

| | TURN NUMBER | | (1) | (2) | (3) |
|---|---|---|---|---|---|
| UNIT HEAD | (1) | [P] | Pa | Pa | Pa |
| | | [V] | 100 | 100 | 100 |
| | (2) | [P] | Pc | Pc | Pc |
| | | [V] | 100 | 100 | 100 |
| | (3) | [P] | Pc | Pc | Pb |
| | | [V] | 100 | 100 | *80 |

54, 55

FIG. 11C
CYCLE TIME IMPROVEMENT PLAN EXECUTION

COMPONENT MOVEMENT: MOVE COMPONENT TYPE Pb TO APPARATUS 2 AND REGENERATE SEQUENCE
PRODUCTION CYCLE TIME IS CHANGED TO 30 SECONDS (BOTTLE NECK IS IMPROVED)

| | TURN NUMBER | | (1) | (2) | (3) |
|---|---|---|---|---|---|
| UNIT HEAD | (1) | [P] | Pa | Pa | Pa |
| | | [V] | 100 | 100 | 100 |
| | (2) | [P] | Pc | Pc | Pc |
| | | [V] | 100 | 100 | 100 |
| | (3) | [P] | Pc | Pc | * |
| | | [V] | 100 | 100 | * |

54, 55

FIG. 12A
(APPARATUS 2)
BEFORE CHANGE OF
COMPONENT DATA

PRODUCTION CYCLE TIME 29 SECONDS

| | TURN NUMBER | | (1) | (2) | (3) |
|---|---|---|---|---|---|
| UNIT HEAD | (1) [Nb] | [P] | Pd | Pd | Pd |
| | | [V] | 80 | 80 | 80 |
| | (2) [Nb] | [P] | Pe | Pe | Pe |
| | | [V] | 80 | 80 | 80 |
| | (3) [Na] | [P] | Pf | Pf | |
| | | [V] | 100 | 100 | |

FIG. 12B

PRODUCTION CYCLE TIME 29 SECONDS

| | TURN NUMBER | | (1) | (2) | (3) |
|---|---|---|---|---|---|
| UNIT HEAD | (1) | [P] | Pd | Pd | Pd |
| | | [V] | 80 | 80 | 80 |
| | (2) | [P] | Pe | Pe | Pe |
| | | [V] | 80 | 80 | 80 |
| | (3) | [P] | Pf | Pf | |
| | | [V] | 100 | 100 | |

FIG. 12C
CYCLE TIME IMPROVEMENT PLAN EXECUTION

COMPONENT MOVEMENT: MOVE COMPONENT TYPE Pb FROM APPARATUS 1 AND REGENERATE SEQUENCE

PRODUCTION CYCLE TIME 29 SECONDS

| | TURN NUMBER | | (1) | (2) | (3) |
|---|---|---|---|---|---|
| UNIT HEAD | (1) | [P] | Pd | Pd | Pd |
| | | [V] | 80 | 80 | 80 |
| | (2) | [P] | Pe | Pe | Pe |
| | | [V] | 80 | 80 | 80 |
| | (3) | [P] | Pf | Pf | *Pb |
| | | [V] | 100 | 100 | *80 |

FIG. 13A
<CYCLE TIME IMPROVEMENT EXAMPLE DUE TO ADDITION OF TYPE OF SUCTION NOZZLE>

NOZZLE CORRESPONDENCE BEFORE CHANGE OF COMPONENT DATA

[P]: COMPONENT TYPE
[N]: NOZZLE TYPE

| | TURN NUMBER | | (1) | (2) | (3) | (4) |
|---|---|---|---|---|---|---|
| UNIT HEAD | (1) | [P] | Pa | Pa | Pa | Pd |
| | | [N] | Na | Na | Na | Na |
| | (2) | [P] | Pc | Pc | Pc | Pc |
| | | [N] | Na | Na | Na | Na |
| | (3) | [P] | Pb | | | |
| | | [N] | Nb | | | |

FIG. 13B
COMPONENT DATA CHANGE

NOZZLE ADDITION: ADD Na TO CORRESPONDING NOZZLE TYPE OF COMPONENT TYPE Pb

| | TURN NUMBER | | (1) | (2) | (3) | (4) |
|---|---|---|---|---|---|---|
| UNIT HEAD | (1) | [P] | Pa | Pa | Pa | Pd |
| | | [N] | Na | Na | Na | Na |
| | (2) | [P] | Pc | Pc | Pc | Pc |
| | | [N] | Na | Na | Na | Na |
| | (3) | [P] | Pb | | | |
| | | [N] | *Na Nb | | | |

FIG. 13C
CYCLE TIME IMPROVEMENT PLAN EXECUTION

ADD NOZZLE TYPE Na TO NOZZLE STOCKING SECTION AND REGENERATE SEQUENCE

| | TURN NUMBER | | (1) | (2) | (3) | (4) |
|---|---|---|---|---|---|---|
| UNIT HEAD | (1) | [P] | Pa | Pa | Pa | |
| | | [N] | Na | Na | Na | |
| | (2) | [P] | Pc | Pc | Pc | |
| | | [N] | Na | Na | Na | |
| | (3) | [P] | Pb | Pc | Pd | |
| | | [N] | Na | Na | Na | |

COMPONENT MOUNTING METHOD AND COMPONENT MOUNTING SYSTEM

CROSS-REFERENCES TO RELATED APPLICATION(S)

This application is based on and claims priority from Japanese Patent Application No. 2014-146439 filed on Jul. 17, 2014, the entire contents of which are incorporated herein by reference.

BACKGROUND

1. Field of the Invention

The present invention relates to a component mounting method and a component mounting system that mount a component onto a board.

2. Description of Related Art

In a component mounting system that produces a component-mounted board, plural types of electronic components are mounted onto a board by a component mounting apparatus. In such a mounting operation, component data that is set in advance according to a component which is a mounting target is referred to. The component data includes, for example, a variety of data such as a speed parameter that regulates, for each component, a suction speed in suctioning and extracting the component by a mounting head, a mounting speed in mounting the extracted component onto the board, or the like, or a recognition parameter that regulates imaging conditions in imaging and recognizing the extracted component by a camera.

The component mounting system includes a component database in which the component data is stored in units of plural types of components. When an operational error such as a suction error or a mounting error that is determined to be caused due to the component data occurs during the mounting operation, data correction for changing the component data is performed (for example, see JP-A-2007-059563 as Patent Literature 1). JP-A-2007-059563 discloses a technique example in which each component registered in a component database is linked to a production program for use of the component, and when the component data is changed, a name of a production program linked to a corresponding component is output in the form of a list or the like.

Patent Literature 1: JP-A-2007-059563

SUMMARY

Since such a data change may have any type of influences on the production efficiency such as a production cycle time or a work quality, when the data is changed, it is preferable to perform a necessary countermeasure in a state where the influence is confirmed. However, in the technique example disclosed in JP-A-2007-059563, it is possible to confirm a production program that may be influenced by the change of the component data, but it is not possible to confirm specific details of the influence. For example, although fluctuation of the production cycle time in a component mounting line among the influences due to the change of the component data is important in a production site, the technique example disclosed in JP-A-2007-059563 does not provide clear information with respect to the influence on the production cycle time due to the change of the component data.

A non-limited object of the present invention is to provide a component mounting method and a component mounting system capable of obtaining clear information with respect to the influence on a production cycle time due to change of component data.

An aspect of the present invention provides a component mounting method in a component mounting apparatus that mounts a component onto a board using a plurality of pieces of production data linked to component data, the method including: executing, when the component data is changed, a simulation of a production cycle time based on the production data; and comparing a simulation result of the production cycle time after change of the component data with a production cycle time or a simulation result of the production cycle time before change of the component data, and outputting a comparison result.

Another aspect of the present invention provides a component mounting system that mounts a component onto a board using a plurality of pieces of production data linked to component data, the system including: a component mounting line that includes a component mounting apparatus that executes an operation of mounting the component onto the board; a simulation executing section that executes, when the component data is changed, a simulation of a production cycle time based on the production data; and a comparison result output section that compares a simulation result of the production cycle time after change of the component data with a production cycle time or a simulation result of the production cycle time before change of the component data, and outputs a comparison result.

According to aspects of the present invention, it may be possible to obtain clear information with respect to the influence on a production cycle time due to change of component data.

BRIEF DESCRIPTION OF THE DRAWINGS

FIGS. 9A to 9C are tables illustrating an improvement example of a production cycle time in a component mounting method according to an embodiment of the present invention.

FIGS. 10A to 10C are tables illustrating an improvement example of a production cycle time in a component mounting method according to an embodiment of the present invention.

FIGS. 11A to 11C are tables illustrating an improvement example of a production cycle time in a component mounting method according to an embodiment of the present invention.

FIGS. 12A to 12C are tables illustrating an improvement example of a production cycle time in a component mounting method according to an embodiment of the present invention.

FIGS. 13A to 13C are tables illustrating an improvement example of a production cycle time in a component mounting method according to an embodiment of the present invention.

DETAILED DESCRIPTION

Figure 1:
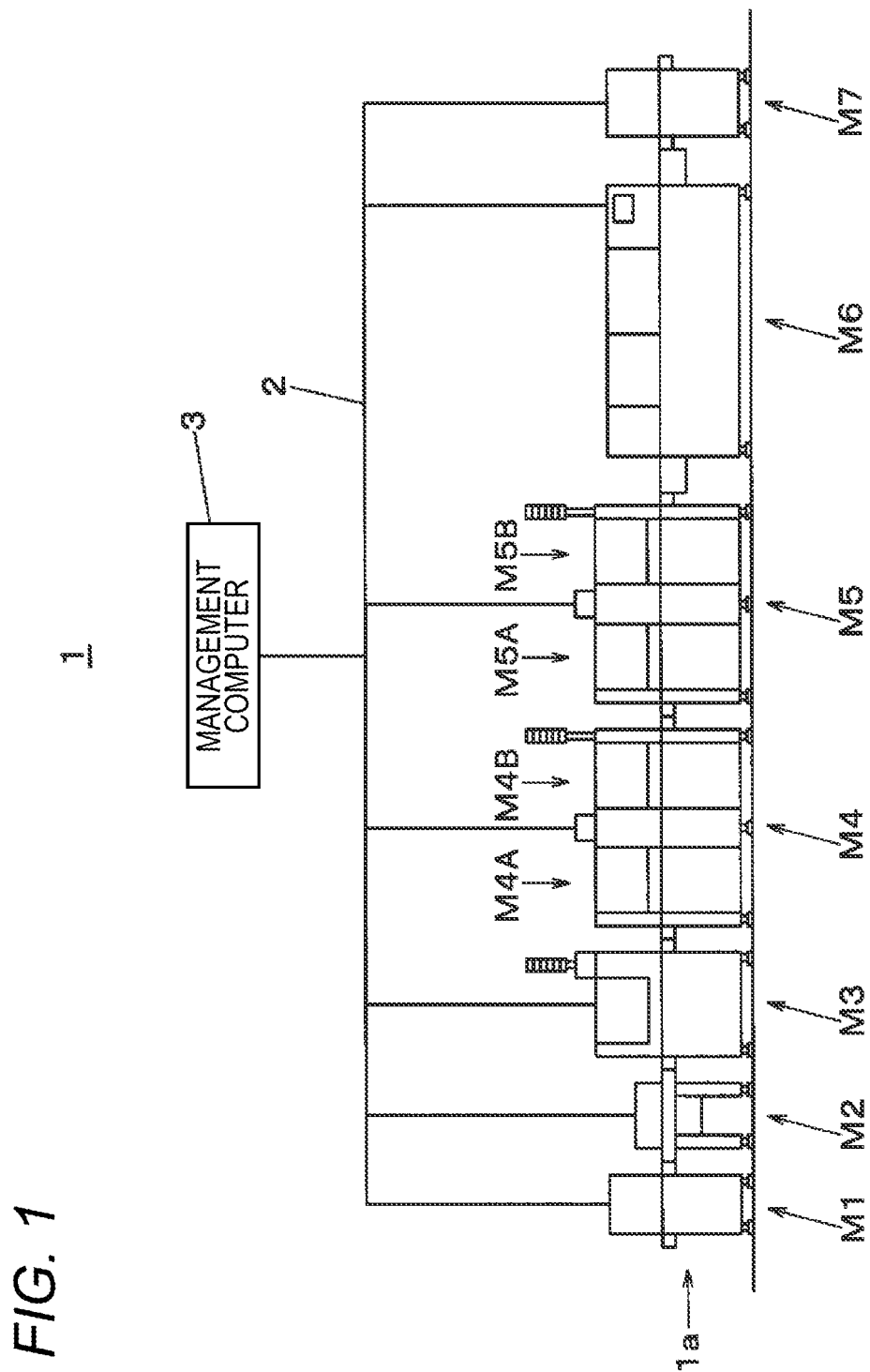
FIG. 1 is a diagram illustrating a configuration of a component mounting system according to an embodiment of the present invention.

Embodiments of the present invention will be described with reference to the accompanying drawings. First, a configuration of a component mounting system 1 will be described with reference to FIG. 1. The component mounting system 1 has a function of mounting an electronic component onto a board to produce a component-mounted board, and provides a component mounting line 1a having a configuration in which a board supplying apparatus M1, a board transfer apparatus M2, a solder printer M3, component mounting apparatuses M4 and M5 having the same configuration, a reflow apparatus M6, and a board receiving apparatus M7 are connected in series, as a main body. Each apparatus of the board supplying apparatus M1 to the board receiving apparatus M7 is connected to a management computer 3 through a communication network 2.

A board 6 (see FIG. 2) supplied by the board supplying apparatus M1 is carried into the solder printer M3 through the board transfer apparatus M2, and in the solder printer M3, a solder printing operation of screen-printing component bonding solder on the board 6 is performed. The solder-printed board 6 is sequentially transferred to the component mounting apparatuses M4 and M5, and a component mounting operation of mounting a component onto the solder-printed board 6 in component mounting stages M4A, M4B, M5A, and M5B that are respectively provided in the component mounting apparatuses M4 and M5 is performed. The component-mounted board 6 is carried into the reflow apparatus M6, and is heated according to a predetermined heating profile, so that the component bonding solder is melted and solidified. Thus, the electronic component is solder-bonded to the board 6, so that a component-mounted board on which the electronic component is mounted is completed. Then, the component-mounted board is received by the board receiving apparatus M7.

Figure 2:
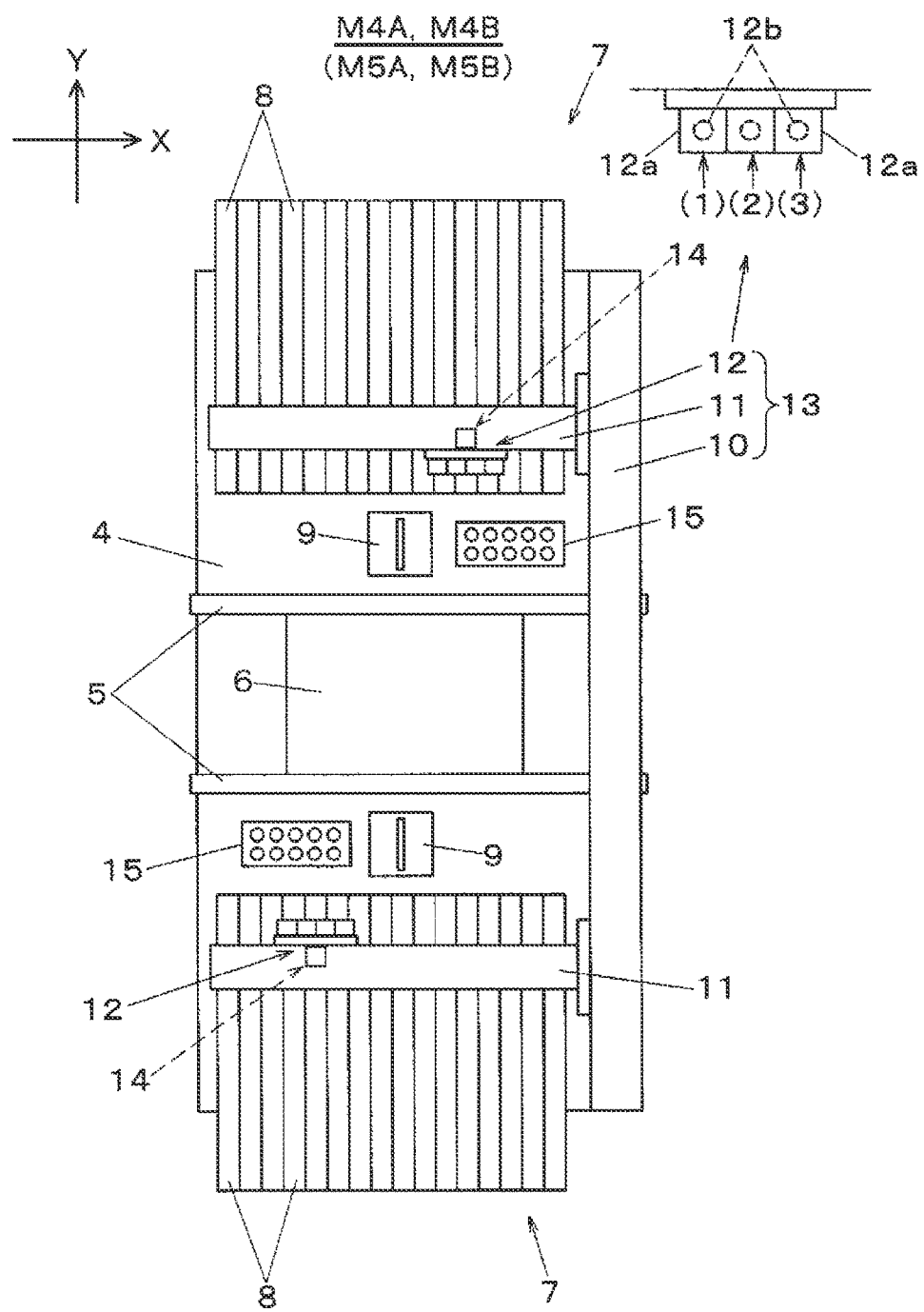
FIG. 2 is a plan view of a component mounting apparatus that is included in a component mounting line according to an embodiment of the present invention.

Next, structures of the component mounting stages M4A, M4B, M5A, and M5B provided in the component mounting apparatuses M4 and M5 will be described with reference to FIG. 2. In FIG. 2, a board transport mechanism 5 is provided on a base 4 in an X direction. The board transport mechanism 5 transports the board 6 on which the electronic component is mounted by a conveyor, and positions the board 6 at a mounting operation position provided on the board transport mechanism 5.

Component supply sections 7 are provided on both sides of the board transport mechanism 5. Plural feeder slots 7a (see FIG. 4A) that are formed in a Y direction for attaching of a tape feeder 8 that supplies a component are arranged in parallel in the X direction, in the component supply section 7. The tape feeder 8 is attached in each feeder slot 7a according to component arrangement data that is set in advance with respect to the type of the board 6. The tape feeder 8 pitch-feeds a carrier tape drawn out from a supply reel to supply the component held by the carrier tape to an extraction position by a mounting head 12 (which will be described later).

In one end portion in the X direction on an upper surface of the base 4, a Y-axis movement table 10 that includes a linear driving mechanism is provided, and similarly, two X-axis movement tables 11 that include a linear driving mechanism are combined with the Y-axis movement table 10 to be movable in the Y direction. In the two X-axis movement tables 11, mounting heads 12 are provided to be movable in the X direction, respectively. The mounting head 12 is a multiple head that includes plural (here, three) unit heads 12a, and a suction nozzle 12b that suctions and holds a component and is individually movable up and down is provided in a lower end portion of each unit head 12a. In the present embodiment, unit head numbers "(1)", "(2)", and "(3)" are given to the respective unit heads 12a to be distinguished from each other.

By driving the Y-axis movement table 10 and the X-axis movement tables 11, the mounting heads 12 move in the X direction and the Y direction. Thus, two mounting heads 12 respectively extract the electronic components by the suction nozzles 12b from the component suction positions of the tape feeders 8 of the corresponding component supply sections 7, and transfer and mount the electronic components onto mounting points of the board 6 positioned by the board transport mechanism 5. The Y-axis movement table 10, the X-axis movement tables 11, and the mounting heads 12 form a component mounting mechanism 13 that moves the mounting heads 12 that hold the electronic components to extract the electronic components from the component supply sections 7 and to transfer and mount the electronic components onto the board 6.

A component recognizing camera 9 and a nozzle stocking section 15 are provided between the component supply section 7 and the board transport mechanism 5. When the mounting head 12 that extracts the component from the component supply section 7 moves above the component recognizing camera 9, the component recognizing camera 9 images and recognizes the component held by the mounting head 12. In the nozzle stocking section 15, the suction nozzles 12b to be provided in the unit head 12a are accommodated according to nozzle arrangement data that is set in advance. The mounting head 12 accesses the nozzle stocking section 15 to execute a predetermined nozzle exchange operation, so that the suction nozzle 12b corresponding to a component which is a holding target is mounted in each unit head 12a.

A board recognizing camera 14 that is provided on a lower surface side of the X-axis movement table 11 and integrally moves with the mounting head 12 is provided on the mounting head 12. As the mounting head 12 moves, the board recognizing camera 14 moves above the board 6 positioned by the board transport mechanism 5, and images and recognizes the board 6. In the component mounting operation with respect to the board 6 performed by the mounting head 12, mounting position correction is performed using a component recognition result from the component recognizing camera 9 and a board recognition result from the board recognizing camera 14.

Figure 3:
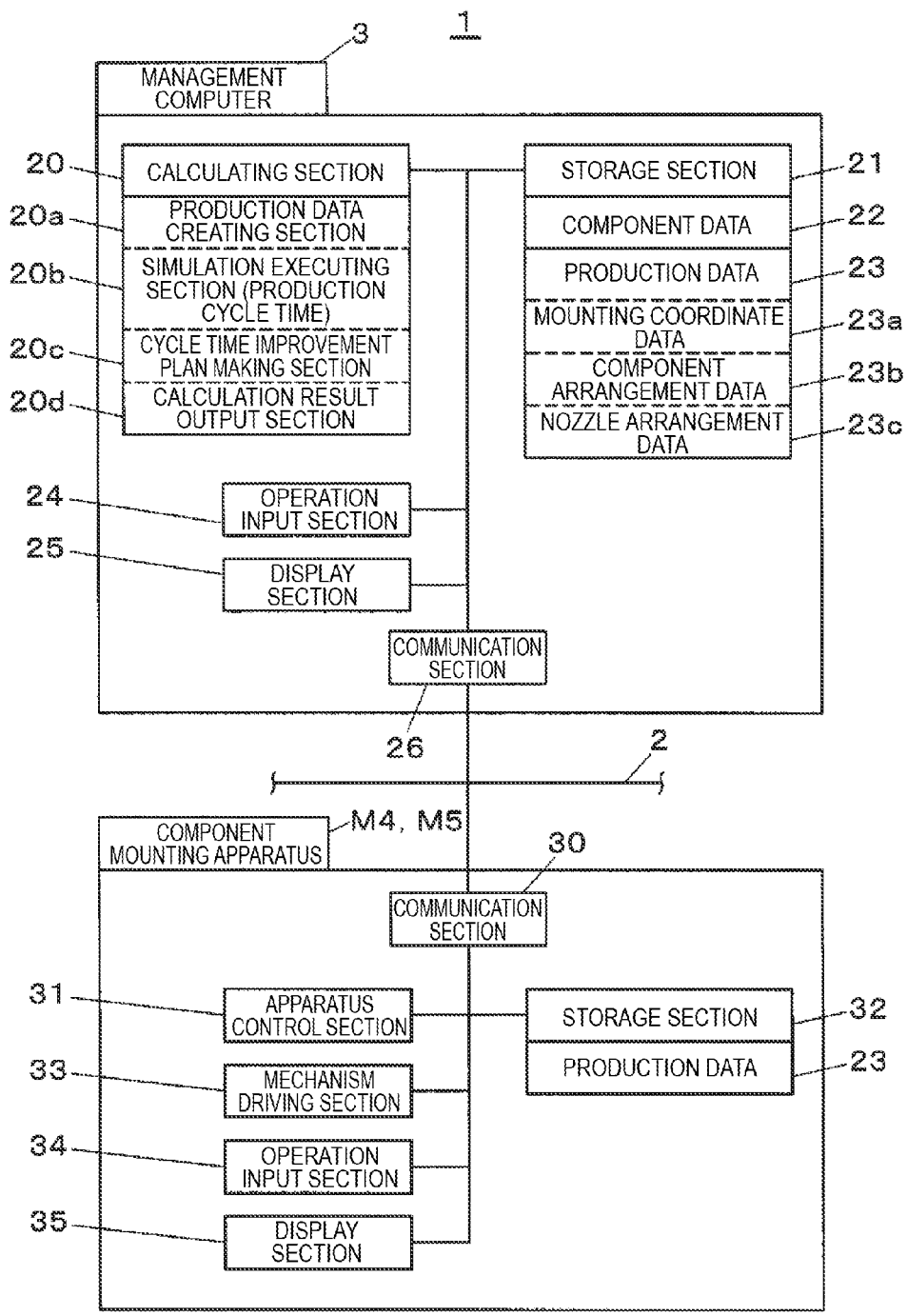
FIG. 3 is a block diagram illustrating a configuration of a control system of a component mounting system according to an embodiment of the present invention.

Next, a configuration of a control system of the component mounting system 1 will be described with reference to FIG. 3. In FIG. 3, a management computer 3 includes a calculating section 20, a storage section 21, an operation input section 24, a display section 25, and a communication section 26, and communicates control signals or data with other apparatuses that form the component mounting system 1 through the communication section 26 which is a communication interface and the communication network 2.

The calculating section 20 includes a production data creating section 20a, a simulation executing section 20b, a cycle time improvement plan making section 20c, and a calculation result output section 20d. Further, component data 22 and production data 23 are stored in the storage section 21, in which the production data 23 includes mounting coordinates data 23a, component arrangement data 23b, and nozzle arrangement data 23c.

The component data 22 refers to information created for each type of a component which is a mounting target. As indicated by a component data registration and editing screen 25a in FIG. 5, the component data 22 includes a component shape 40 of a component P which is a target, component related information 41 indicating a size 41a, the number of leads 41b, lead width and length 41c, and the like, and mounting operation condition information 42 that regulates mounting operation conditions of the component P in the component mounting apparatus.

The mounting operation condition information 42 includes a nozzle type 43 indicating the type of the suction nozzle 12b used corresponding to the type of a component, a speed parameter 44 such as a suction speed 44a or a mounting speed 44b that regulates the speed of the component mounting operation by the component mounting mechanism 13, and the like. Further, the mounting operation condition information 42 also includes imaging conditions 45 such as a camera type 45a and an illumination condition 45b used in imaging the component extracted by the mounting head 12 by an imaging tool (component recognizing camera 9).

That is, the component data 22 in the present embodiment is formed to include at least one of the suction speed 44a in suctioning and extracting the component by the suction nozzle 12b, the imaging conditions 45 in imaging the extracted component by the imaging tool, the mounting speed 44b in mounting the component onto the board 6, and the nozzle type 43 of the used suction nozzle 12b in the component mounting apparatuses M4 and M5.

The production data 23 is stored as a component data library that includes plural component types. When it is necessary to change any piece of data during execution of the component mounting operation, a change process is performed through the component data registration and editing screen 25a shown in FIG. 5. In the present embodiment, the component data registration and editing screen 25a is displayed on a monitor screen of a display section 35 provided in the component mounting apparatuses M4 and M5, and the component data 22 is corrected on the screen. Here, the component data 22 may be corrected through the display section 25 of the management computer 3.

The changed content may be reflected in the production data 23 of all board types that use the component. That is, the plural pieces of production data 23 used in the component mounting line 1a are linked to the component data 22, and in the component mounting apparatuses M4 and M5, the component mounting operation of mounting the component onto the board using the plural pieces of production data 23 linked to the component data 22 is executed. Whether to reflect the change of the component data 22 in the production data 23 of all the board types may be arbitrarily set according to a user's selection.

The production data 23 refers to data that is referred to when the board type of the production target is used as an operation target in the component mounting apparatus. In the production data 23, as described above, the component mounting operation of mounting the component onto the board using the plural pieces of production data 23 linked to the component data 22 is executed in the component mounting apparatuses M4 and M5 included in the component mounting line 1a.

Figure 4A:
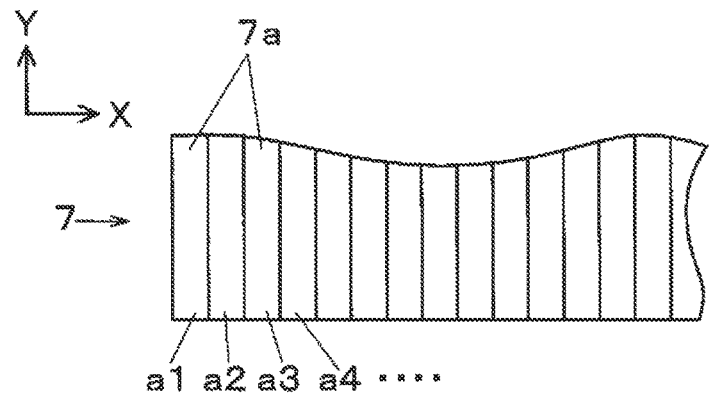
FIGS. 4A and 4B are diagrams illustrating production data in a component mounting system according to an embodiment of the present invention.

The mounting coordinates data 23a refers to data indicating positions of component mounting points according to the board types, and is stored as position coordinates in a machine coordinating system of the component mounting apparatuses M4 and M5. The component arrangement data 23b refers to data indicating arrangement of the tape feeders 8 in the respective component supply sections 7 of the component mounting apparatuses M4 and M5. That is, as shown in FIG. 4A, slot addresses 7b (a1, a2, a3, . . . ) are respectively assigned to the plural feeder slots 7a provided for attaching the tape feeders 8 to the component supply section 7. In the component arrangement data 23b, a component type [P] indicating the type of component stored in the tape feeder 8 corresponds to each of the slot addresses 7b.

Figure 4B:
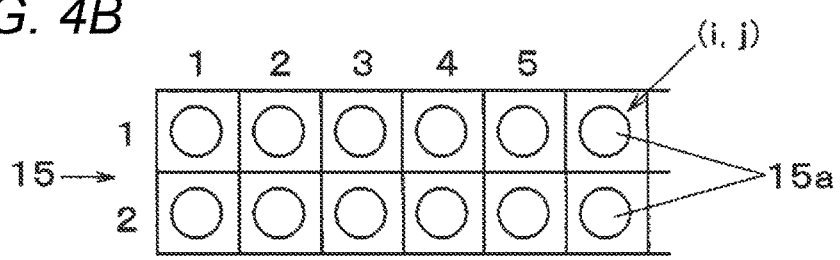

The nozzle arrangement data 23c refers to data indicating arrangement of the suction nozzles 12b in the nozzle stocking section 15 of the component mounting apparatuses M4 and M5. That is, as shown in FIG. 4B, stocking holes 15a for stocking the suction nozzles 12b are provided in a matrix form in the nozzle stocking section 15, and stocking addresses 15b for specifying the stocking holes 15a are assigned to the respective stocking holes 15a in the form of matrix coordinates (i, j). In the nozzle arrangement data 23c, a nozzle type [N] indicating the type of the suction nozzle 12b corresponds to each of the stocking addresses 15b.

The production data creating section 20a has a function of creating the production data 23 used in production of a mounting board of each board type. That is, component arrangement in the component supply section 7 of each of the component mounting apparatuses M4 and M5, nozzle arrangement in the nozzle stocking section 15, and an operation sequence indicating the operation order in the component mounting operation are determined based on the component data 22 stored in the storage section 21. The created production data 23 is stored in the storage section 21 for each board type.

When creating the production data 23 by the production data creating section 20a, an operation (calculation) is performed to achieve optimization for improvement of the efficiency of the component mounting operation under predetermined restriction conditions. As the restriction conditions, for example, a cycle time priority pattern for prioritizing reduction of an operation time of the mounting head 12 in the component mounting operation, a change-over operation priority pattern for prioritizing reduction of a change-over operation according to switching of a board type to be produced, a combination pattern thereof, or the like may be used, which may be appropriately selected according to a production type in an actual component mounting line 1a.

The simulation executing section 20b performs a simulation of the component mounting operation based on the created production data 23. Here, a production cycle time simulation that calculates a production cycle time indicating a time necessary for the component mounting operation executed in each component mounting stage of the component mounting stages M4A, M4B, M5A, and M5B, using one board as a target, is executed. In the present embodiment, when the component data 22 is changed, for example, in correction of a machine parameter (mounting operation condition information 42) of the component performed when a tendency that an operational error such as a suction error or a mounting error with respect to a specific component frequently occurs is found, the production cycle time simulation is executed based on the production data 23 by the simulation executing section 20b.

Figure 6:
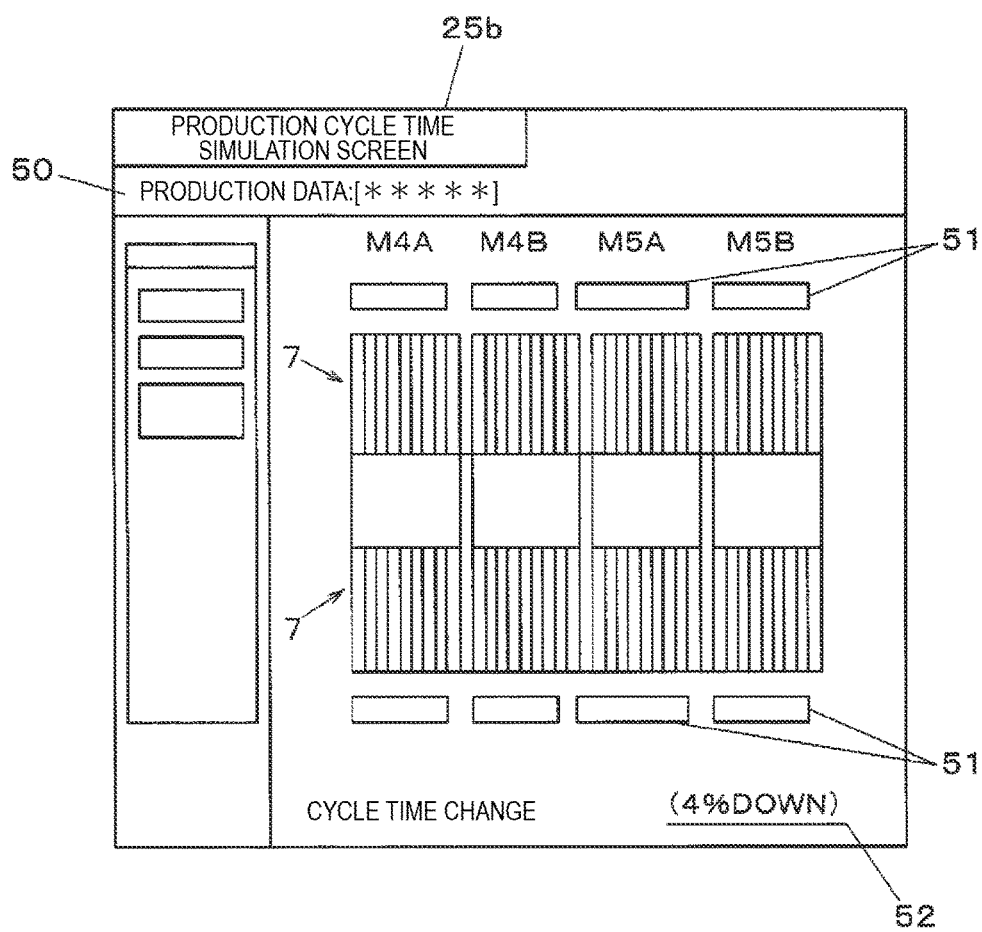
FIG. 6 is a diagram illustrating a production cycle time simulation screen in a component mounting system according to an embodiment of the present invention.

FIG. 6 shows a production cycle time simulation screen 25b that displays a simulation result of a production cycle time. On the production cycle time simulation screen 25b, production cycle time calculation results of the component mounting operations in the respective component mounting stages M4A, M4B, M5A, and M5B are individually displayed on cycle time calculation result display sections 51 of the respective mounting stages as numerical data, for the board type which is a simulation target displayed in a production data display section 50.

Further, on the production cycle time simulation screen 25b, a comparison result obtained by comparing production cycle time simulation results before and after change of the component data is displayed in a cycle time change display section 52. Here, the comparison result is displayed by regarding a bottleneck stage that has the longest production cycle time in the component mounting stages M4A, M4B, M5A, and M5B to rate-determine the entire production cycle time of the component mounting line 1a as a target for the comparison. In FIG. 6, an example in which the component mounting stage M5B corresponds to the bottleneck stage and the production cycle time is reduced by 4% due to change of the component data is shown. As a method for outputting the comparison result, various display methods such as a method for displaying the degree of cycle time change or a method for displaying numerical values of the production cycle times before and after the change of the component data in parallel may be used.

Figure 5:
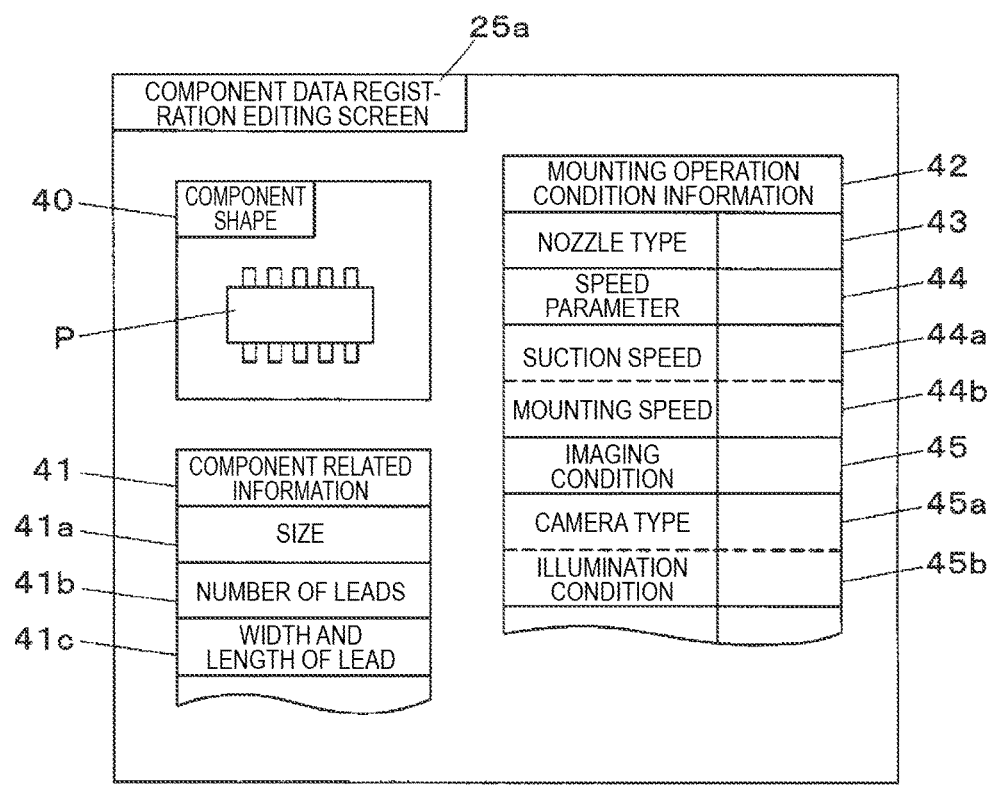
FIG. 5 is a diagram illustrating a registration and editing screen of component data in a component mounting system according to an embodiment of the present invention.

The cycle time improvement plan making section 20c performs a calculation (operation) process of making an improvement plan when data change of the component data 22 is input through the component data registration and editing screen 25a shown in FIG. 5 and deterioration of the production efficiency is predicted when the cycle time simulation is executed by the simulation executing section 20b. The calculation process is executed based on a predetermined improvement plan making algorithm.

Figure 7:
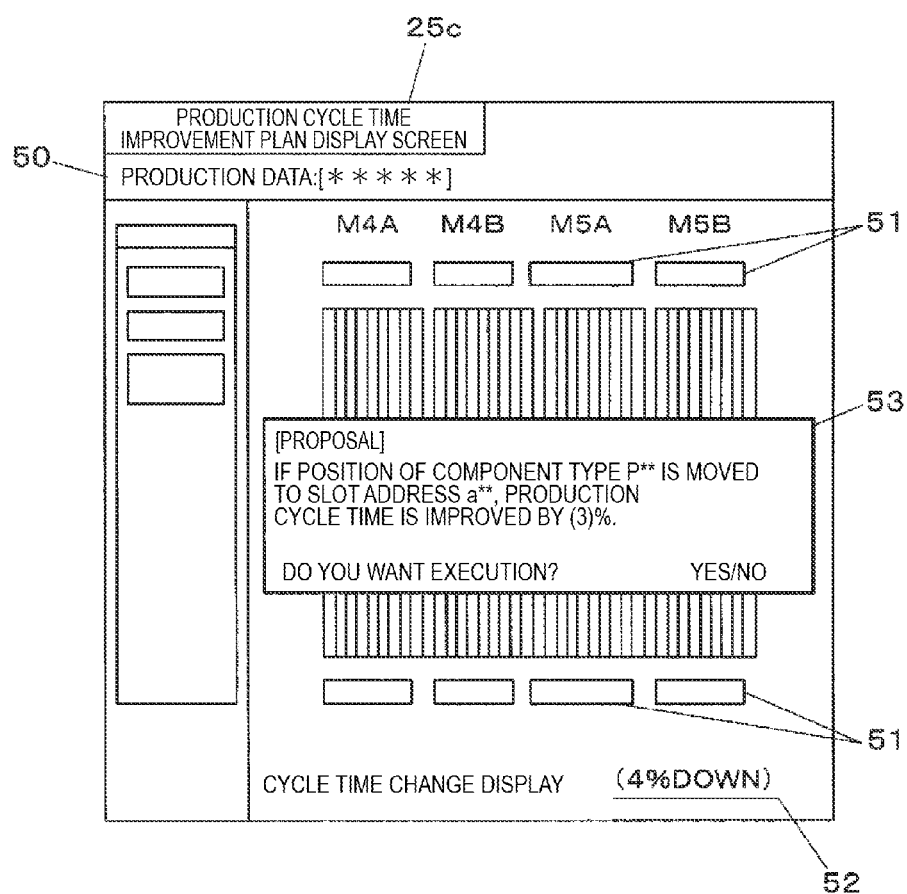
FIG. 7 is a diagram illustrating a production cycle time improvement plan display screen in a component mounting system according to an embodiment of the present invention.

FIG. 7 shows a production cycle time improvement plan display screen 25c. On the production cycle time improvement plan display screen 25c, an improvement plan display frame 53 for proposing the improvement plan is displayed to overlap the production cycle time simulation screen 25b. In the improvement plan display frame 53, specific content for improvement and an estimated improvement effect (herein, production cycle time improvement degree) if a proposal were to be employed and executed are displayed. Further, an inquiry for prompting determination of whether to employ the proposal for execution may also be displayed.

The calculation result output section 20d performs a process of outputting calculation results from the production data creating section 20a, the simulation executing section 20b, and the cycle time improvement plan making section 20c, and displaying the calculation results in the display section 25. Thus, the production cycle time simulation screen 25b shown in FIG. 6, and the production cycle time improvement plan display screen 25c shown in FIG. 7 are displayed in the display section 25.

In the above-described configuration, the calculation result output section 20d functions as a comparison result output section that compares a simulation result of the production cycle time before change of the component data with a simulation result of the production cycle time after change of the component data and outputs a comparison result, and also functions as an improvement plan output section that makes an improvement plan for the production cycle time as a target based on the simulation result after change of the component data and outputs the improvement plan.

The operation input section 24 is an input device that includes a pointing device such as a keyboard or a mouse, and performs operation input or data input to the management computer 3. The display section 25 is a display device such as a liquid crystal panel, and displays a guide screen in operation input such as the component data registration and editing screen 25a, or various screens such as the production cycle time simulation screen 25b or the production cycle time improvement plan display screen 25c. The communication section 26 is a communication interface, and communicates control signals or data with other apparatuses such as the component mounting apparatuses M4 and M5 through the communication network 2.

The component mounting apparatuses M4 and M5 include a communication section 30, an apparatus control section 31, a storage section 32, a mechanism driving section 33, an operation input section 34, and a display section 35. The communication section 30 is a communication interface, and communicates signals with the management computer 3 or other apparatuses through the communication network 2. The apparatus control section 31 controls an operation of the component mounting apparatus based on data necessary for execution of a component mounting operation such as the production data 23 stored in the storage section 32. The mechanism driving section 33 is controlled by the apparatus control section 31 to drive the board transport mechanism 5 or the component mounting mechanism 13. The operation input section 34 is an input device such as a touch panel, and performs operation input or data input to the component mounting device. The display section 35 is a display device such as a liquid crystal panel, and displays a guide screen in operation input through the operation input section 34 or various notification screens.

Next, the flow of the component mounting operation executed using plural pieces of production data linked to the component data in the component mounting apparatuses M4 and M5 that form the component mounting system 1 will be described with reference to FIG. 8. Here, in the component mounting operation of extracting the component arranged in the component supply section 7 by the mounting head 12 and transferring and mounting the component onto the board 6, when any operational error such as a suction error or a mounting error is detected with respect to a specific component, a process in correcting component data that is determined as a cause with respect to a component type where the operational error occurs is shown.

Figure 8:
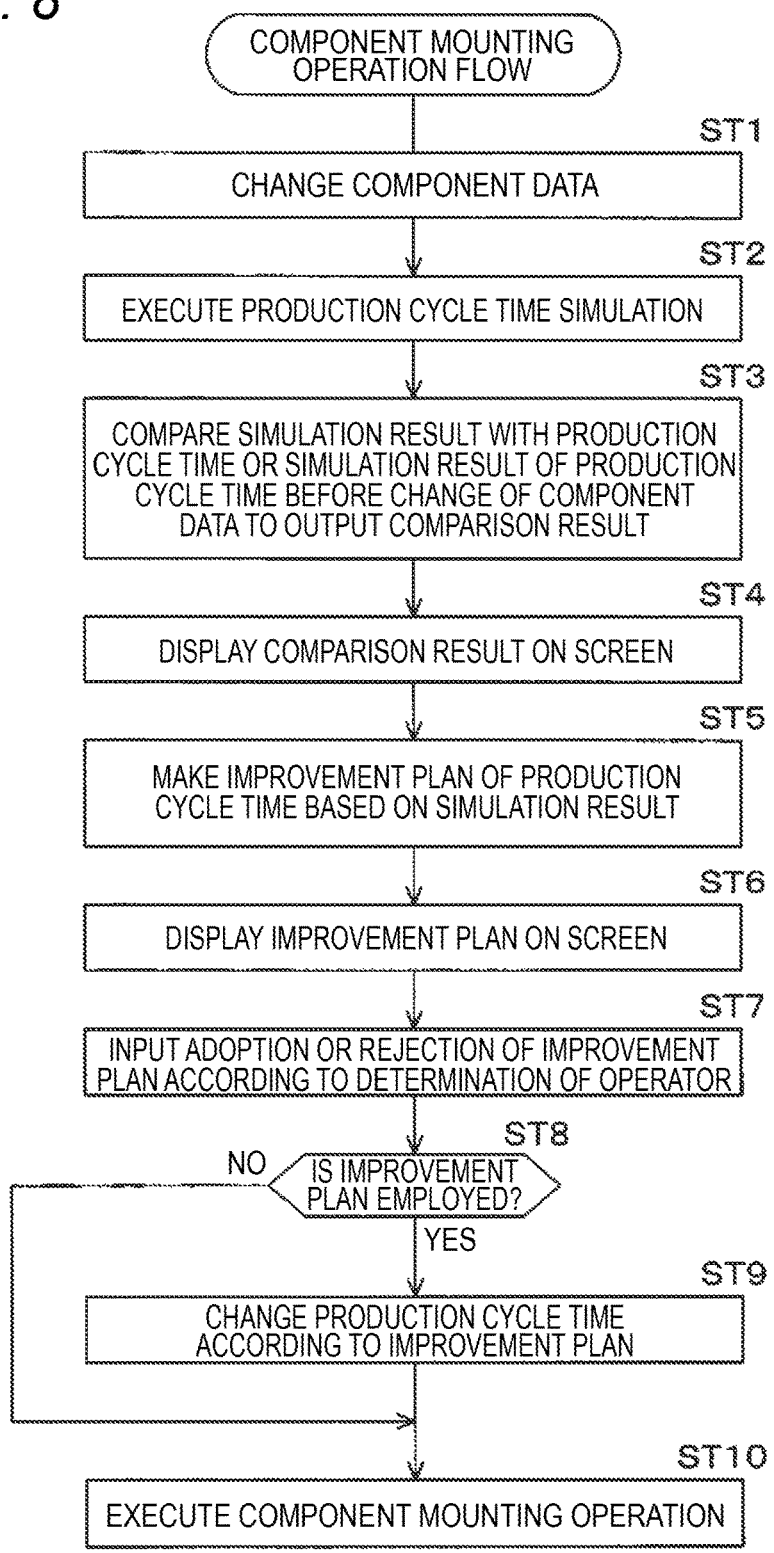
FIG. 8 is a flowchart illustrating an operation process of a component mounting method according to an embodiment of the present invention.

In FIG. 8, the component data 22 determined as the cause of the error is changed (ST1). Then, a simulation of the production cycle time is executed by the simulation executing section 20b using the changed component data 22 (ST2). That is, when the component data 22 is changed, the simulation of the production cycle time is executed based on the production data 23 linked to the component data using the changed component data 22 (simulation executing process).

Then, the simulation result is compared with the production cycle time or the simulation result of the production cycle time before change of the component data 22, and the simulation result is output by the calculation result output section 20d (ST3). Then, the output comparison result is displayed as the production cycle time simulation screen 25b (FIG. 6) on the screen of the display section 25 (ST4). Here, the comparison target may be a production cycle time which is a performance value before change of the component data, or a production cycle time simulation result executed before change of the component data. That is, the simulation result of the production cycle time after change of the component data 22 is compared with the production cycle time or the simulation result of the production cycle time before change of the component data 22, and the comparison result is output (comparison result output process).

Then, an improvement plan for the production cycle time is made and output based on the above-described simulation result by the cycle time improvement plan making section 20c (ST5), and the output improvement plan is displayed on the screen of the display section 25 in the form of the production cycle time improvement plan display screen 25c (FIG. 7) shown in FIG. 7 (ST6). That is, the improvement plan is made and output using the production cycle time as a target based on the simulation result after change of the component data (improvement plan output process).

Further, an operator checks the displayed production cycle time improvement plan display screen 25c, and inputs adoption or rejection of the improvement plan according to determination of the operator (ST7). That is, the operator checks content of the improvement plan display frame 53 displayed on the production cycle time improvement plan display screen 25c to check validity of the proposal, and determines whether to employ the improvement plan (ST8). Here, if the proposed content is valid and an input for employment of the improvement plan is performed, a process of correcting the production data 23 according to the improvement plan is automatically executed (ST9).

Here, if the content of the improvement plan display frame 53 is content according to a work operation by the operator, for example, content according to change of the component arrangement as in the example shown in FIG. 7, the operator executes an operation based on the content of the proposal. Then, the component mounting operation is subsequently executed (ST10). Similarly, when an input for non-employment of the improvement plan is performed in ST8, the component mounting operation is subsequently executed.

Next, an example of the improvement plan for the production cycle time made by the cycle time improvement plan making section 20c will be described with reference to FIGS. 9A to 13C. Here, as an example of the change of the component data, an example in which an operation speed such as a suction speed or a mounting speed is changed is shown. That is, if a work operation is executed at a maximum speed (100%) of the equipment capacity, an operational error such as a suction error or a mounting position shift may frequently occur. In such a case, it is known that there is a possibility of stabilizing the operation state by reducing the speed to suppress the operational error. Here, an example in which deterioration of the production cycle time as the speed of a component type Pb among plural component types is changed from 100% to 80% is remedied is shown.

First, FIGS. 9A to 9C show a cycle time improvement example due to a change in an operation sequence. In FIGS. 9A to 12C, [P] represents a component type, and [V] represents a speed expressed as a ratio (%) with respect to the maximum speed. In each diagram, a turn number indicated as "turn number" 54 represents a number associated with each mounting turn in which the suction nozzle 12b reciprocates between the component supply section 7 and the board 6 in an operation sequence that regulates the execution order of the mounting operation. Here, numbers "(1)", "(2)", and "(3)" are given in the execution order.

Unit head numbers "(1)", "(2)", and "(3)" for individually specifying the plural unit heads 12a provided in the suction nozzles 12b are denoted under "unit head" 55. Further, for the unit head numbers "(1)", "(2)", and "(3)", the component type [P] of the component held by each unit head 12a and the speed [V] regulated by the component data 22 according to the component type in the mounting turn of each turn number are both denoted.

Here, FIG. 9A shows a state before change of the component data. With respect to all mounting turns with the turn numbers "(1)", "(2)", and "(3)", respective components of component types Pa, Pc, and Pb are held by the unit heads 12a with the unit head numbers "(1)", "(2)", and "(3)". Further, in the unit head numbers "(1)", "(2)", and "(3)", the speed V of 100% is set with respect to all the turn numbers "(1)" to "(3)".

FIG. 9B shows the content of the component data change, in which the speed V is changed from 100% to 80% in order to suppress the operational error with respect to the component type Pb (see *80 with "*"). In FIGS. 9A to 13C, items with "*" are related to the component data change. Here, the speed change is not applied to the component types Pa and Pc, but since the unit heads 12a with the unit head numbers "(1)", "(2)", and "(3)" integrally move as the same mounting head 12 in the component mounting operation, an actual speed V is not 100% with respect to any turn number of "(1)" to "(3)", and is 80% that is set with respect to the unit head number "(3)". That is, the speed change with respect to one component type Pb affects the entire component mounting operation, which results in deterioration of the entire production cycle time.

FIG. 9C shows an improvement plan for realizing cycle time improvement by regenerating the operation sequence of regulating the execution order of the mounting operation in order to prevent such a problem. That is, in the improvement plan, the operation sequence is regenerated so that the component of the component type Pb of which the speed is reduced to 80% by the change of the component data is held by all the unit heads 12a with the unit head numbers "(1)", "(2)", and "(3)" in a first mounting turn with the turn number "(1)", and so that the components of the component types Pc and Pa are held by all the unit head numbers "(1)", "(2)", and "(3)" in each of the mounting turns with the turn numbers "(2)" and "(3)".

By the sequence regeneration, while the speed is reduced from 100% to 80% in the mounting turn with the turn number "(1)", the speed is maintained at 100% in the mounting turns with the turn numbers "(2)" and "(3)" similar to the time before change of the component data. That is, it is possible to restrict deterioration of the production cycle time due to the speed change of the component type Pb to only one mounting turn, and to suppress deterioration of the entire production cycle time to the minimum.

FIGS. 10A to 10C shows a cycle time improvement example due to the change of the component arrangement in the component supply section. Here, FIG. 10A shows a state before change of the component data, in which the respective components of the component types Pa, Pb, and Pd are held by the unit heads 12a with the unit head numbers (1), (2), and (3), with respect to the first mounting turn with the turn number "(1)". Further, the components of the component types Pa, Pc, and Pb are held in the unit heads 12a with the unit head numbers "(1)", "(2)", and "(3)", with respect to the mounting turns with the turn numbers "(2)" and "(3)", respectively.

In the unit heads 12a with the unit head numbers "(1)", "(2)", and "(3)", the speed of 80% is set only with respect to the component type Pd held by the unit head number "(3)" in the turn number "(1)", and the speed V of 100% is set with respect to the component types Pa and Pb held by the unit heads 12a with the unit head numbers "(1)" and "(3)". Further, the speed V of 100% is set with respect to all the unit head numbers "(1)", "(2)", and "(3)" that respectively hold the component types Pa, Pb, and Pc, with respect to the mounting turns with the turn numbers "(2)" and "(3)".

FIG. 10B shows the content of the component data change, similar to the example shown in FIG. 9B, in which the speed V is changed from 100% to 80% in order to suppress the operational error with respect to the component type Pb (see *80 with "*"). Here, as described in the example of FIG. 9B, since the unit heads 12a with the unit head numbers "(1)", "(2)", and "(3)" integrally move as the same mounting head 12 in the component mounting operation, an actual speed V is not set to 100% but is set to 80% that is set with respect to the unit head number "(3)" with respect to the mounting turns with the turn numbers of "(2)" and "(3)" in addition to the turn number "(1)" including the component type Pd of which the speed V is set to 80% from the beginning in FIG. 10B. That is, the speed change with respect to the component type Pb affects other component mounting operations, which results in deterioration of the entire production cycle time.

FIG. 10C shows an improvement plan for realizing cycle time improvement by changing the component arrangement in the component supply section 7 in order to prevent such a problem. In the improvement plan, the tape feeder 8 that holds the component of the component type Pb is moved and the operation sequence is regenerated so that the component type Pb of which the speed is reduced to 80% by the component data and the component type Pd of which the speed V is set to 80% compared with the initial speed before the data is changed can be simultaneously suctioned in the same mounting turn, that is, so that the component types Pb and Pd can be simultaneously suctioned.

Here, in the mounting turn with the turn number "(1)", the component arrangement is changed so that the component type Pb is held in the unit heads 12a with the unit head numbers "(1)" and "(2)" and the component of the component type Pd is held in the unit head 12a with the unit head number "(3)". Further, in the mounting turn with the turn number "(2)", the operation sequence is regenerated so that the component of the component type Pc is held in any unit head number "(1)", "(2)", or "(3)", and in the mounting turn with the turn number "(3)", the operation sequence is generated so that the component of the component type Pa is held in any unit head number "(1)", "(2)", or "(3)".

Due to the change of the component arrangement and the regeneration of the sequence, in the mounting turn with the turn number "(1)", the speed V is maintained at 80% which is the initial setting speed, and in the mounting turns with the turn numbers "(2)" and "(3)", the speed V is maintained at 100% similar to the speed before change of the component data. That is, it is possible to substantially suppress the influence of deterioration of the production cycle time due to the change of the speed of the component type Pb.

Further, FIGS. 11A to 11C and 12A to 12C show cycle time improvement examples due to exchange of component arrangement between plural apparatuses. Similar to the examples shown in FIGS. 9A to 9C and 10A to 10C, these examples have the purpose of suppressing deterioration of the production cycle time due to the change of component data for reducing the speed V for the component type Pb. Here, between the plural component mounting apparatuses M4 (apparatus 1) and M5 (apparatus 2) that are included in the component mounting line 1a, the component arrangement due to exchange of the tape feeder 8 is changed. Here, it is assumed that the mounting head 12 that uses the suction nozzles 12b of the same nozzle type is present in the component supply section 7 of another apparatus.

FIG. 11A shows a state of the apparatus 1 before change of the component data. In the apparatus 1, the suction nozzle 12b of a nozzle type Na is mounted in all the unit heads 12a with the unit head numbers "(1)", "(2)", and "(3)", and only the component of a component type having a correspondence relationship with the nozzle type Na in the component data 22 becomes a mounting operation target.

The respective components of the component types Pa, Pc, and Pb are respectively held in the unit heads 12a with the unit head numbers "(1)", "(2)", and "(3)", with respect to all the mounting turns with the turn numbers "(1)", "(2)", and "(3)". Further, in the unit head numbers "(1)", "(2)", and "(3)", the speed V of 100% is set with respect to all the turn numbers "(1)", "(2)", and "(3)". Further, in this state, the production cycle time becomes 30 seconds which is a bottleneck cycle time.

FIG. 12A shows a state of the apparatus 2 before change of the component data. In this state, the production cycle time of the apparatus is 29 seconds, which is not the bottleneck cycle time of the mounting line. In the apparatus 2, the suction nozzle 12b of a nozzle type Nb is mounted in all the unit head numbers "(1)" and "(2)", and the suction nozzle 12b of the nozzle type Na is mounted in the unit head number "(3)", respectively. Accordingly, only the component of a component type having a correspondence relationship with the nozzle type Nb in the component data 22 becomes a mounting operation target, with respect to the unit head numbers "(1)" and "(2)", and only the component of a component type having a correspondence relationship with the nozzle type Na becomes a mounting operation target, with respect to the unit head number "(3)".

The component type Pd is held in the unit head 12a with the unit head number "(1)", and a component type Pe is held in the unit head 12a with the unit head number "(2)", with respect to all the mounting turns with the turn numbers "(1)", "(2)", and "(3)". Further, each component of a component type Pf is held by the unit head number 55a "(3)" only with respect to second mounting turns with the turn numbers "(1)" and "(3)". Further, the speed V of 80% is set with respect to the component type Pd and the component type Pe, and the speed V of 100% is set with respect to the component type Pf. Further, in this state, the production cycle time becomes 29 seconds.

FIG. 11B shows the content of the component data change. That is, the speed V is changed from 100% to 80% with respect to the component type Pb (see *80 with "*") due to the same reason as in the example shown in FIG. 9B. As a result, in the turn number "(3)" where the unit head 12a with the unit head number "(3)" holds the component of the component type Pb, the speed is reduced with respect to all the unit heads 12a with the unit head numbers "(1)", "(2)", and "(3)" that integrally move as one mounting head 12 due to the influence of the speed change, and thus, the entire production cycle time (bottleneck cycle time) deteriorates to 31 seconds. In the apparatus 2, since the component type Pb which is the component data change target is not the operation target, the influence due to the component data change does not occur. Accordingly, the content shown in FIG. 12B is the same as that shown in FIG. 12A.

FIG. 11C and FIG. 12C show improvement plans for realizing cycle time improvement by exchange of component arrangement between the apparatus 1 and the apparatus 2 in order to prevent the deterioration of the production cycle time. In the improvement plan, the component type Pb of which the speed is reduced to 80% due to the component data change is moved from the apparatus 1 to the apparatus 2, and the operation sequence is regenerated, and thus, the component type Pb becomes a mounting target in the same mounting turn together with the component types Pd and Pf of which the speed V is set to 80% from the beginning.

That is, as shown in FIG. 11C, an operation by the unit head 12a with the unit head number "(3)" in the turn number "(3)" of which the component type Pb is an operation target is canceled. Further, as shown in FIG. 12C, as an operation target of the unit head 12a with the unit head number "(3)" in the mounting turn with the turn number "3" in which the operation target is not present at the beginning, the component type Pb moved from the apparatus 1 is allocated. In the apparatuses 1 and 2, since the nozzle type Na is mounted on all the unit heads 12a of all the unit head numbers "(3)", the movement of the component which is the operation target is not prevented due to incompatibility of the nozzle.

By executing the improvement plan, in the apparatus 1, it is possible to remove the component type Pb of which the speed V is reduced to 80% by the component data change from the mounting turn with the turn number "(3)", and to prevent reduction of the production cycle time of the mounting turn. Further, in the apparatus 2, since the speed V of the component which is the operation target is 80% from the beginning in the mounting turn with the turn number "(3)", almost no deterioration in the production cycle time due to the movement of the component type Pb occurs.

Next, FIGS. 13A to 13C show cycle time improvement examples due to addition of a suction nozzle type. In the production data 23, a correspondence relationship between a component and a nozzle type of a suitable suction nozzle is regulated, and a suction nozzle other than the nozzle type regulated in the production data 23 cannot be used. Here, the correspondence relationship is not absolutely strict, and a nozzle type that is not originally regulated in the production data 23 may be added as a corresponding nozzle with respect to a certain component type as necessary. Further, in some cases, it is possible to improve the production cycle time by the addition of the nozzle type. Hereinafter, a specific example will be described. In FIGS. 13A to 13C, [P] indicates a component type, and [N] indicates a nozzle type of the suction nozzle 12b.

FIG. 13A shows a component mounting operation based on a nozzle correspondence relationship before change of the component data. Here, components of the component types Pa, Pb, Pc, and Pd are operation targets, in which the component types Pa, Pc, and Pd have a correspondence relationship with the nozzle type Na, and only the component type Pb has a correspondence relationship with the nozzle type Nb. Here, the suction nozzle 12b of the nozzle type Na is mounted on the unit heads 12a with the unit head numbers "(1)" and "(2)", and the suction nozzle 12b of the nozzle type Nb is mounted on the unit head 12a with the unit head number "(3)".

The number of components which are mounting targets is nine, which includes three component types Pa, one component type Pb, four component types Pc, and one component type Pd. The operation sequence shown in FIG. 13A is determined in consideration of the number of components according to the component types and the nozzle types according to the nozzles. Here, since only one component type Pb is present, the unit head 12a with the unit head number 55a "(3)" on which the nozzle type Nb is mounted performs component mounting only in the mounting turn of the first turn number "(1)". Accordingly, in order to separately mount the remaining eight component types in the unit heads 12a with the unit head numbers "(1)" and "(2)", four mounting turns with the turn numbers "(1)" to "(4)" are necessary, which increases the number of mounting turns to cause deterioration of the production cycle time.

In order to prevent such a problem, in this example, a component data change of adding the nozzle type Na to the nozzle type corresponding to the component type Pb is performed as a cycle time improvement plan. Thus, it is possible to suction the component of the component type Pb not only using the nozzle type Nb but also using the nozzle type Na.

Further, by executing such a cycle time improvement plan, as shown in FIG. 13C, it is possible to add the suction nozzle 12b of the nozzle type Na to the nozzle stocking section 15 to be mounted on the unit head 12a with the unit head number "(3)", to thereby regenerate the operation sequence. That is, the component types Pc and Pd that are not allowed as operation targets by the unit head number "(3)" are used as operation targets by the unit head 12a with the unit head number "(3)" by the turn numbers "(2)" and "(3)". Thus, it is possible to mount nine components through three mounting turns without the mounting turn with the turn number "(4)" which is necessary in the initial operation sequence, and to achieve improvement of the entire operation cycle time.

That is, as shown in FIGS. 9A to 13C, the improvement plan made as the improvement of the production cycle time in the component mounting system 1 includes at least one of the change of the operation sequence of the component mounting operation of extracting a component by the suction nozzle 12b and mounting the component onto the board 6 (FIGS. 9A to 9C), the change of the component arrangement in the component supply section 7 (FIGS. 10A to 10C), the addition of a suction nozzle to be used (FIG. 13A to 13C), and the exchange of the component arrangement (FIGS. 11A to 11C and 12A to 12C) between plural component mounting apparatuses, in the component mounting apparatuses M4 and M5. Any information other than the above-described mounting operation condition information may be considered as an improvement plan target as long as it is mounting operation condition information considered to affect the production cycle time.

As described above, in the component mounting method and the component mounting system shown in the present embodiments, when mounting a component onto the board using plural pieces of production data linked to component data, when the component data is changed, the production cycle time simulation is executed based on the production data, and the simulation result of the production cycle time after change of the component data is compared with the production cycle time or the simulation result of the production cycle time before change of the component data to output the comparison result, and an improvement plan in which the production cycle time is a target is made based on the simulation result after change of the component data and is output.

With reference to such a comparison result, it is possible to obtain clear information, when the component data is changed, with respect to the influence on the production cycle time for a board type being produced during the time of change and for other board types having production data linked to the component data. Further, by proposing an improvement plan for a negative influence on the production efficiency due to the change of the production data, it is possible to secure superior productivity.

The component mounting method and the component mounting system of the present invention have an effect of allowing clear information to be obtained with respect to the influence on a production cycle time due to change of component data, which is useful in a component mounting field where a component is mounted onto a board to produce a component-mounted board.

What is claimed is:

1. A component mounting method in a plurality of component mounting apparatuses that mounts components onto a board using a plurality of pieces of production data linked to component data, the method comprising:
   changing the component data in order to suppress an operational error with respect to a component type;
   executing, after changing the component data, a simulation of a production cycle time based on a changed production data; and
   comparing a simulation result of the production cycle time after change of the component data with a production cycle time or a simulation result of the production cycle time before change of the component data, and outputting a comparison result regarding a bottleneck stage that has a longest production cycle time among the plurality of component mounting apparatuses,
   wherein the component data includes at least one of a component shape, component size, a number of leads, lead width, lead length, and a mounting operation condition information.

2. The component mounting method according to claim 1, wherein the mounting operation condition information regulates a component mounting operation condition in the plurality of component mounting apparatuses.

3. The component mounting method according to claim 1 wherein the mounting operation condition information includes at least one of a suction speed in suctioning and extracting the components by a suction nozzle, an imaging condition in imaging the extracted components by an imaging tool, a mounting speed in mounting the components on the board, and a type of suction nozzle that is used, in the plurality of component mounting apparatuses.

4. The component mounting method according to claim 1, wherein the operational error comprises a suction error or a mounting position shift with respect to the components.

5. A component mounting system configured to mount components onto a board using a plurality of pieces of production data linked to component data, the system comprising:
   a component mounting line that includes a plurality of component mounting apparatuses that executes an operation of mounting the components onto the board;
   an operation input and display section configured to display a component data registration and editing screen and configured to input a change to the component data in order to suppress an operational error with respect to a component type;
   a simulation executing section that executes, after the component data is changed, a simulation of a production cycle time based on the production data; and
   a comparison result output section that compares a simulation result of the production cycle time after change of the component data with a production cycle time or a simulation result of the production cycle time before change of the component data, and outputs a comparison result regarding a bottleneck stage that has a longest production cycle time among the plurality of component mounting apparatuses,
   wherein the component data includes at least one of a component shape, component size, a number of leads, lead width, lead length, and a mounting operation condition information.

6. The component mounting system according to claim 5, wherein the mounting operation condition information regulates a component mounting operation condition in the plurality of component mounting apparatuses.

7. The component mounting system according to claim 5, wherein the mounting operation condition information includes at least one of a suction speed in suctioning and extracting the components by a suction nozzle, an imaging condition in imaging the extracted components by an imaging toot, a mounting speed in mounting the components on the board, and a type of suction nozzle that is used, in the plurality of component mounting apparatuses.

* * * * *